(12) United States Patent
Bartsch et al.

(10) Patent No.: US 6,905,916 B2
(45) Date of Patent: Jun. 14, 2005

(54) METHOD FOR PROCESSING A SURFACE OF AN SIC SEMICONDUCTOR LAYER AND SCHOTTKY CONTACT

(75) Inventors: Wolfgang Bartsch, Erlangen (DE); Michael Treu, Villach (AT); Roland Rupp, Lauf (DE)

(73) Assignee: Infineon Technologies AG, Munich (DE)

( * ) Notice: Subject to any disclaimer, the term of this patent is extended or adjusted under 35 U.S.C. 154(b) by 78 days.

(21) Appl. No.: 10/146,585

(22) Filed: May 15, 2002

(65) Prior Publication Data

US 2002/0187622 A1 Dec. 12, 2002

Related U.S. Application Data

(63) Continuation of application No. PCT/EP00/11260, filed on Nov. 14, 2000.

(30) Foreign Application Priority Data

Nov. 15, 1999 (DE) .......................................... 199 54 866

(51) Int. Cl.$^7$ ............................................... H01L 29/74

(52) U.S. Cl. ........................ 438/133; 438/570; 438/582

(58) Field of Search ................................ 438/133, 570, 438/582, 542, 583, 584, 607, 689, 694, 712, 745, 931

(56) References Cited

U.S. PATENT DOCUMENTS

| | | |
|---|---|---|
| 4,981,551 A | 1/1991 | Palmour |
| 5,011,549 A | 4/1991 | Kong et al. |
| 5,895,260 A | 4/1999 | Bhatnagar |
| 6,214,107 B1 * | 4/2001 | Kitabatake .................. 438/273 |

FOREIGN PATENT DOCUMENTS

| | | |
|---|---|---|
| DE | 1 000 533 | 1/1957 |
| DE | 44 06 769 C2 | 9/1995 |
| DE | 195 07 130 A1 | 10/1996 |
| JP | 61 150 272 A | 7/1986 |
| JP | 62 222 672 A | 9/1987 |

OTHER PUBLICATIONS

Constantinidis ("Processing technologies for SiC", Semiconductor Conference, 1997. CAS '97 Proceedings., 1997 International , vol.: 1 , Oct. 7–11, 1997 Page(s): 161–170 vol.1).*

Constantinidis et al. "Diffusion of gold in 3C–SiC epitaxially grown on Silicon structural characterization", Materials Science & Engineering, B: Solid–State Materials for Advanced Technology (1997), B46 (1–3), pp. 186–189.*

Marinova et al. "Nickel–based ohmic contacts on SiC", Materials Science & Engineering, B: Solid–State Materials for Advanced Technology (1997), B46 (1–3), pp. 223–226.*

S. M. Tang et al.: "Titanium Silicide Ohmic Contacts for High Temperature S–SiC Devices", The Electro–Chemical Society, Fall Meeting, Chicago, Illinois, Oct. 9–14, 1988, Extended Abstracts, vol. 88–2, No. 466, p. 680.

(Continued)

Primary Examiner—Luan Thai
(74) Attorney, Agent, or Firm—Laurence A. Greenberg; Werner H. Stemer; Gregory L. Mayback

(57) ABSTRACT

A method for treating a surface on an SiC semiconductor body produced by epitaxy. According to the method, the parts of the epitactic layer that are deposited in the final phase of the epitaxy are removed by etching and a wet chemical treatment is then carried out in order to remove a thin natural oxide on the surface. Alternatively, a metal layer configured as a Schottky contact and/or as an ohmic contact can also be applied to the surface immediately after the removal process.

11 Claims, 1 Drawing Sheet

OTHER PUBLICATIONS

Joseph S. Shor et al.: "High Temperature Ohmic Contact Metallizations for n–Type 3C–SiC", *Journal of the Electrochemical Society,* vol. 141, No. 2, Feb. 1994, pp. 579–581.

Ts. Marinova et al.: "Nickel based ohmic contacts on SiC", *Materials Science and Engineering,* vol. B46, 1997, pp. 223–226.

T. Teraji et al.: "Ideal Ohmic contact to n–type 6H–SiC by reduction of Schottky barrier height", *Appl. Phys. Lett.,* vol. 71, No. 5, Aug. 4, 1997, pp. 689–691.

N. Kornilios et al.: "Diffusion of gold in 3C0SiC epitaxially grown on Si Structural characterization", *Materials Science and Engineering,* vol. B46, 1997, pp. 186–189.

Defives, D. et al.: "Barrier Inhomogeneities and Electronical Characertistics of Ti/4H–SiC Schottky Rectifiers", IEEE Transactions on Electron Devices, vol. 46, No. 3, Mar., 1999, pp. 449–455.

Edmond, J. A. et al.: "Electrical Contacts to Beta Silicon Carbide Thin Films", Journ. Electrochem. Soc., vol. 135, No. 2, Feb., 1988, pp. 359–362.

Ivanov, P.A. et al.: "Semiconductor Silicon Carbide—Technology and Devices: A Review", American Institute of Physics, Nov. 1995, pp. 1003–1013.

Nishino, K. et al.: "Photoluminescence of Homoepitaxial 3 C–SiC on Sublimation–Grown 3 C–SiC Substrates", Jpn. J. Appl. Phys., vol. 34, No. 9A, 1995, pp. L1110–L1113.

Nishino, K. et al.: "Reduction of Double Positioning Twinning in 3C–SiC Grown on α–SiC Substrates", Jpn. J. Appl. Phys., vol. 36, No. 8, 1997, pp. 5202–5207.

Porter, L. M. et al.: "A Critical Review of Ohmic and Rectifying Contacts for Silicon Carbide", Elsevier Science S. A., 1995, pp. 83–105.

Rhoderick, E. H. et al.: "Metal–Semiconductor Contacts", Oxford University Press, 1988, pp. 93–98.

* cited by examiner

METHOD FOR PROCESSING A SURFACE OF AN SIC SEMICONDUCTOR LAYER AND SCHOTTKY CONTACT

CROSS-REFERENCE TO RELATED APPLICATION

This application is a continuation of copending International Application No. PCT/EP00/11260, filed Nov. 14, 2000, which designated the United States and was not published in English.

BACKGROUND OF THE INVENTION

Field of the Invention

The present invention relates to a method for processing a surface of an epitaxially fabricated SiC semiconductor layer, in which a metal layer is applied as a contact on the surface after the epitaxy. The present invention furthermore relates to a Schottky contact fabricated, in particular, according to the method.

The properties of SiC Schottky diodes depend largely on the state of the surface of a SiC semiconductor body before the deposition of a Schottky metal for forming the Schottky contact on the surface, since the Schottky contact quality that can be obtained is critically influenced by the quality of the metal-semiconductor junction. A height of the potential barrier at the junction between the Schottky metal and the semiconductor body, that is to say at the metal-semiconductor boundary layer, is primarily determined by the following properties:

a) a position of the Fermi level in the semiconductor body;

b) a position of the Fermi level in the metal of the Schottky contact; and c) a state density at the interface between the Schottky metal and the semiconductor body.

The position of the Fermi level in the semiconductor body is primarily determined by the doping of the body and defect density, while the position of the Fermi level in the metal of the Schottky contact depends principally on the type of metal. The state density is principally determined by the process sequence during the fabrication of the SiC Schottky diode.

There are already various methods that allow the fashioning of specific potential barriers for various metals as Schottky contacts. These include, inter alia, wet-chemical surface preparations on the semiconductor body, so-called sacrificial oxidation and a heat treatment at high temperatures in various gas atmospheres. In all these methods, a surface modification achieved by the processing employed is utilized for setting a desired potential barrier.

SUMMARY OF THE INVENTION

It is accordingly an object of the invention to provide a method for processing a surface of an sic semiconductor layer and a schottky contact which overcome the above-mentioned disadvantages of the prior art methods and devices of this general type, which improves the quality of metal layers on epitaxially fabricated SiC semiconductor layers. Moreover, the intention is to specify a Schottky contact fabricated, in particular, according to the method.

With the foregoing and other objects in view there is provided, in accordance with the invention, a method for processing a surface of an epitaxially fabricated SiC semiconductor layer. The method includes the steps of subjecting the surface of the SiC semiconductor layer to a removal process, wet-chemically processing the surface for removing a natural surface oxide and being performed directly before an application of a metal layer, and applying the metal layer functioning as a contact on the surface of the SiC semiconductor layer.

Accordingly, a method of the type mentioned in the introduction is provided in which the surface, before the application of the metal layer, is subjected to a removal process that is followed by a subsequent wet-chemical processing of the surface for the purpose of removing a natural surface oxide. The surface is subjected to the removal process before the application of the metal layer and, directly after the removal process, the metal layer formed as a Schottky contact and/or as an ohmic contact is applied to the surface.

The object relating to the configuration is achieved by the Schottky contact fabricated by the method according to the invention. The schottky contact is formed from a tungsten containing metal layer, a titanium containing metal layer, and/or a tantalum-containing metal layer on a silicon carbide semiconductor body. A barrier height, measured by a current/voltage measurement, is above 1.05 eV for tungsten, 1.15 eV or more for titanium, and 0.95 eV or more for tantalum, for a rapid thermal processing at 400° C.

A removal process or removal of a layer from the surface is to be understood as a complete stripping of the layer, so that the layer just removed is no longer connected to the semiconductor body. An oxidation process, in which, in the broader sense, a part of the regions of the semiconductor body which adjoin the surface is also "removed", is not meant by this term, since, as is known, the regions "removed" by oxidation are still part of the semiconductor body or adhere to the latter and are only stripped from the latter by an additional, generally wet-chemical etching process.

The wet-chemical processing in this case serves for stripping a thin natural oxide which forms in an undesirable manner after a certain time in the case of silicon-containing semiconductor bodies. The thickness of the thin oxide generally varies in the region of a few nanometers.

The invention is based on the now described insight. The epitaxy constitutes a "non-equilibrium process" which can be subdivided into three phases, namely a nucleation phase at the beginning of the epitaxial growth, a flow equilibrium phase during the epitaxial growth and a concluding phase during the switch-off of the epitaxy. In the concluding phase, although the process gases required for the epitaxy are switched off macroscopically, the gas concentration in the epitaxy reactor decreases only comparatively slowly with time after the switch-off, so that residues of the various gases may still be present even in the subsequent cooling phase. By way of example, to produce an n⁻ conducting epitaxial layer, $SiH_4$ (silane) $C_3H_8$ (propane) and $N_2$ (as dopant) are used during the reaction. Correspondingly, the concentration of the reactants can also fluctuate if e.g. the three gas flow controllers are closed in a specific order. In particular, this has the effect that the state of the surface of the semiconductor body cannot be controlled sufficiently accurately.

In order to overcome this difficulty, in the case of the present invention, from a growth rate r of the epitaxy and a time duration T of the above-mentioned concluding phase of the epitaxy process, a thickness D of a layer is determined which must be removed by suitable etching methods, in order thus to uncover the "undisturbed" layers of the flow equilibrium phase. In this case, the layer thickness D is determined by the product of the growth rate r with the time duration T and is optimally 75 nm, for example, given a growth rate of 3 µm/H and a concluding phase of, for example, 1.5 min.

In an advantageous manner, a surplus of 10%, at most 50%, may additionally be attached to such a removal, in order to counteract uncertainties in the determination of the growth rate r, the reactor switch-off time and the etching rates of the removal process.

Suitable methods for etching SiC are, in particular, dry etching methods, such as reactive ion etching (RIE), ion beam etching (IBE), or etching methods in the gas phase.

An RIE method in a gas mixture having fluorine-containing gases and oxygen is particularly advantageous not least with regard to the integration of the etching step into the process sequence for fabricating the Shottky diode, since here the fluorine component reacts with the silicon of the semiconductor body to form volatile fluoride compounds and the oxygen component oxidizes the carbon of the semiconductor body.

A chemically inert gas such as, for example, argon or helium, may additionally be admixed with a gas mixture of this type, in order to slightly increase the physical removal or to prevent redeposition effects at patterned surface parts of Schottky diodes.

In accordance with the invention, the removal process is performed in two stages. Preferably, an ion implantation with a subsequent annealing process is performed between the two stages.

In the process control, it is advantageous for the power density and the bias voltage or substrate bias voltage established in the reactor to be kept as small as possible. The bias voltage is brought about by self-charging of the substrate holder in a plasma excited by radio frequency.

The method according to the invention can be used to perform a removal process in a planar reactor, for example, if in a gas mixture containing 50 cm$^3$ SF$_6$, 10 cm$^3$ O$_2$ and 5 cm$^3$ Ar at a gas pressure of 28 µbar, a plasma is ignited with a power density of 0.4 W/cm$^2$ at a bias or substrate bias voltage of −260 V. After such an RIE method, it must be ensured by a wet-chemical treatment directly before the metallization that the surface is freed of silicon dioxide. This is advantageously achieved by dipping in buffered hydrofluoric acid "BHF-Dip" for approximately 5 min with subsequent rinsing in ultra pure water and drying. Immediately afterward, the metallization is then expediently applied by sputtering or vapor deposition.

The removal of the parts of an epitaxial layer that are produced during the concluding phase of an epitaxy process affords the following essential advantages. The ending of an epitaxial growth is a process which is intrinsically difficult to monitor and control, so that it is in no way ensured that the topmost atomic layers of the epitaxial layer have the same material properties, especially with regard to doping and defect density, as the underlying volume of the epitaxial layer that has grown continuously during the flow equilibrium phase. This "uncertainty factor" caused by the difficult-to-control process is eliminated by etching away the topmost parts of the epitaxial layer which have grown during the concluding phase. By way of example a RIE or an IBE process can be employed for this etching away, as has been explained above.

In any event, the removal results in process certainty for the subsequent steps, so that the latter also become independent of the process control during the epitaxy.

The process of removing the topmost parts of the epitaxial layer by etching leads to a very stable surface of the semiconductor body made of SiC, as shown by numerous experiments by the inventors, and to a highly reproducible state density.

Thus, it is possible, by the method according to the invention, to fabricate a Schottky diode in which a barrier height which is dependent only on the choice of the respective Schottky metal can be set in a reproducible manner.

It must be emphasized, however, that outstanding ohmic contacts on epitaxially layers can also readily be fabricated by the method according to the invention.

The method according to the invention, in which the parts of an epitaxial layer that are produced during the concluding phase are removed by etching, can advantageously be employed in virtually any process sequence for fabricating a semiconductor component. By way of example, before a metallization, there may be a need for extensive implantation steps, in order to produce, for instance, p-conducting implanted regions, and heat treatment steps for activation of implanted atoms. In such cases, expediently, the removal of the topmost parts of an epitaxial layer that are produced during the concluding phase of the epitaxy is not performed until directly before the respective metallization. In this case—in the configuration of the implantation profiles—the required removal must then be taken into account, however, in such a way that the implantation depth is increased by this removal or—if the implantation energy does not suffice—the implantation concentration with regard to the required surface charge is increased by a proportion corresponding to the removal.

If the required removal of the parts of the epitaxial layer that are produced in the concluding phase comes within the region of the maximum possible range of implanted ions, which is a few 100 nm, then it is advantageous to split the etching process: by way of example, a required removal of at least 250 nm results with a growth rate of 10 µm/h and a switch-off time of about 1.5 min. In order to be able to implant the ions sufficiently deeply, a layer with a thickness of about 180 nm is removed here directly after the epitaxy. The remaining layer with a layer thickness of 70 nm is then removed only after the ion implantation. Such "splitting in two" has the advantage that the parts of the epitaxial layer which are applied during the concluding phase of the epitaxy are eliminated, and that defect concentration changes which are induced by the process sequence, such as, for example, an ion implantation or heat treatment steps, are prevented.

It is particularly advantageous if the semiconductor body is subjected to an elevated temperature during the fabrication of the Schottky contacts, that is to say during the deposition of the metal, the silicide or a similar material, since, as a result, the surface is freed of liquid residues and, consequently, a better contact is possible. It is particularly advantageous if the elevated temperature is greater than 100° C., although even lower temperatures already yield significantly improved effects. It goes without saying that this method can also advantageously be used as preparation for the fabrication of ohmic contacts.

Overall, the method according to the invention enables a series of essential advantages. The etching process leads to a stable surface of the semiconductor body composed of a silicon carbide and to a highly reproducible state density. A barrier height dependent on the choice of the respective Schottky metal can thus be set in a reproducible manner. The same also applies correspondingly to the fabrication of ohmic contacts.

The surface of the semiconductor body made of silicon carbide is cleaned by the removal by etching. In other words, the concentration of impurity atoms, which could possibly alter the height of the Schottky potential barrier, decreases.

Disadvantageous consequences of the concluding phase of the epitaxial process, which is difficult to control and monitor, are eliminated.

In the method according to the invention, before the metallization with the Schottky metal, the natural oxide (silicon dioxide) is removed by a wet-chemical treatment. In the case of the fabrication of Schottky diodes, metals, such as, for example, tungsten, tantalum, titanium, etc., can then immediately be deposited by sputtering or vapor deposition. In the case of sputtering, care should be taken to ensure that at least at the beginning of the sputtering process, the power density is kept low with vanishing bias voltage (in particular 0 V). After deposition of the first atomic layers, the power density can then be increased, in which case the bias voltage can also increase.

With the foregoing and other objects in view there is provided, in accordance with the invention, a Schottky contact. The Schottky contact contains a silicon carbide semiconductor body having a surface subjected to a wet-chemical process for removing a natural surface oxide, and a metal layer disposed on the silicon carbide semiconductor body and formed from tungsten, titanium, and/or tantalum. The metal layer on the silicon carbide semiconductor body forms a metal-semiconductor contact having a barrier height—measured by a current/voltage measurement—of above 1.05 eV in the case of tungsten, of above 1.15 eV in the case of titanium, and above 0.95 eV in the case of tantalum.

Other features which are considered as characteristic for the invention are set forth in the appended claims.

Although the invention is illustrated and described herein as embodied in a method for processing a surface of an SiC semiconductor layer and a Schottky contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
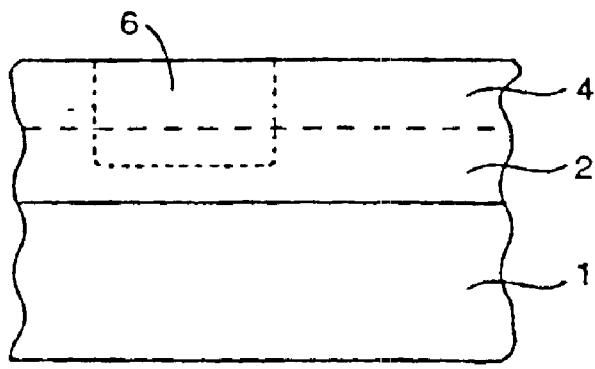
FIGS. 1 to 3 are diagrammatic, sectional views showing different steps of a method according to the invention.

Referring now to the figures of the drawing in detail and first, particularly, to FIG. 1 thereof, there is shown an epitaxially deposited SiC layer 2 situated on an SiC semiconductor body 1. The part of the layer 2 that is produced during the concluding phase of the epitaxy lies above a dashed line and is provided with reference symbol 4.

At this point, it is possible to perform a local ion implantation, as is necessary for example, for fabricating an implanted region 6 as a bipolar edge termination of the Schottky diode.

Figure 2:
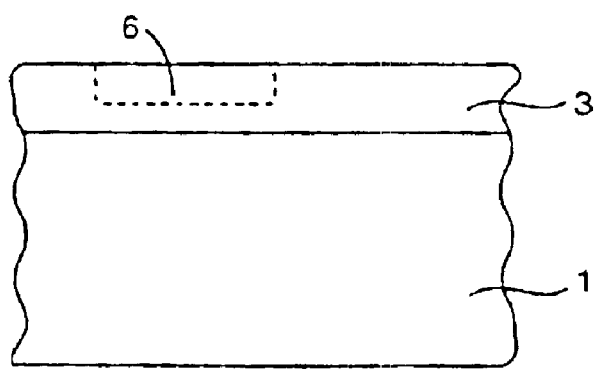

After a heat treatment for annealing the implanted ions and subsequent cleaning of the configuration shown in FIG. 1, a part 4 of the epitaxial layer 2 is removed by RIE. A wet-chemical treatment is then performed. The configuration shown in FIG. 2 is thus present, in which an epitaxial layer 3 of reduced layer thickness is provided on the semiconductor body 1.

There then follows a metallization 5 with tungsten, titanium or tantalum, etc., by sputtering or vapor deposition.

Figure 3:
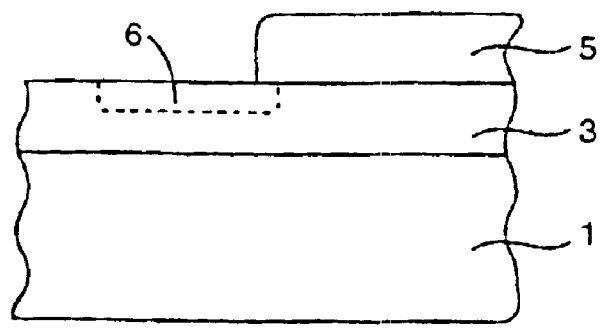

A thermal treatment (RTP=rapid thermal processing) is subsequently performed at, for example, 400° C. or 800 to 900° C. The configuration shown in FIG. 3 is obtained in this way, in which the Schottky contact 5 is provided on the epitaxial layer 3.

Typical barrier heights $\phi_B$ for tungsten are 1.1 eV after heat treatment or RTP at 400° C. and above 1.1 eV after RTP at 800 to 900° C. For titanium, the barrier height $\phi_B$ is 1.15 eV or more if hydrogen etching is additionally introduced between the heat treatment of the implanted regions and the cleaning according to the above method (after RTP at 400° C.).

Generally, the barrier heights of a Schottky junction are to be determined by current/voltage measurements in the forward direction. The barrier height determined and the measured values must correspond in the temperature range between −50° and 150° C., to the theoretical description by thermionic emission according to R. H. Rhoderick, R. H. Williams, Metal-Semiconductor Contacts, Oxford University Press 1988, page 96, equation (3.10). Correspondence is given if the standard deviation of the logarithm of the theoretical current in amperes from the logarithm of the measured current in amperes lies below 0.1, to be precise in the curve region in which the measured current is dominated by the Schottky effect. The ideality and the Richardson constant result from the current/voltage measured values at various temperatures. The following are thus obtained:

| Metal | Barrier | Ideality | at Doping |
| --- | --- | --- | --- |
| Titanium | >1.20 eV | <1.07 | $5 \cdot 10^{15}$ cm$^{-3}$ to $2 \cdot 10^{16}$ cm$^{-3}$ |
| Tungsten | >1.05 eV | <1.07 | $5 \cdot 10^{15}$ cm$^{-3}$ to $2 \cdot 10^{16}$ cm$^{-3}$ |
| Tantalum | >0.95 eV | <1.08 | $5 \cdot 10^{15}$ cm$^{-3}$ to $2 \cdot 10^{16}$ cm$^{-3}$ |

We claim:

1. A surface processing method, which comprises:

providing an epitaxially fabricated SiC semiconductor layer;

subjecting a surface of the SiC semiconductor layer to a removal process;

subsequently wet-chemically processing the surface for removing a natural surface oxide undesirably formed thereon, the wet chemical process being performed directly before an application of a metal layer; and applying the metal layer functioning as a contact on the surface of the SiC semiconductor layer.

2. The method according to claim 1, which comprises forming the contact as at least one of a Schottky contact and an ohmic contact.

3. The method according to claim 2, which comprises applying the metal layer for the contact to the surface of the SiC semiconductor layer at a given temperature.

4. The method according to claim 3, which comprises setting the given temperature to be more than 100° C.

5. The method according to claim 1, which comprises performing an etching process selected from the group consisting of a dry etching process and a gas phase etching process as the removal process.

6. The method according to claim 5, which comprises performing at least one of a reactive ion etching and an ion beam etching as the dry etching process.

7. The method according to claim 6, which comprises using a gas mixture having fluorine-containing gases and oxygen in the reactive ion etching.

8. The method according to claim 6, which comprises using a gas mixture having an inert gas and oxygen in the reactive ion etching.

9. The method according to claim 1, which comprises forming the metal layer at least in part as an alloy containing at least one metal selected from the group consisting of titanium, tantalum, and tungsten.

10. The method according to claim 1, which comprises performing the removal process in at least two stages.

11. The method according to claim 10, which comprises carrying out an ion implantation with a subsequent annealing process between the at least two stages.

* * * * *